(12) United States Patent
Bozovic et al.

(10) Patent No.: US 6,251,530 B1
(45) Date of Patent: Jun. 26, 2001

(54) THIN-FILM OF A HIGH-TEMPERATURE SUPERCONDUCTOR COMPOUND AND METHOD

(75) Inventors: Ivan Bozovic, Palo Alto; James N. Eckstein, Cupertino, both of CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 07/931,632

(22) Filed: Aug. 18, 1992

(51) Int. Cl.$^7$ ..................................................... B32B 19/00
(52) U.S. Cl. .......................... 428/688; 428/689; 428/930; 505/121; 505/125; 505/126; 505/220; 505/234; 505/235; 505/236; 505/238; 505/239
(58) Field of Search ..................................... 505/1, 701–4, 505/121, 125, 126, 220, 239, 238, 234, 235, 236; 428/688, 689, 930

(56) References Cited

U.S. PATENT DOCUMENTS

| | | | |
|---|---|---|---|
| 4,983,575 | * | 1/1991 | Komuro ................................... 505/1 |
| 5,047,390 | * | 9/1991 | Higashino ................................ 505/1 |

OTHER PUBLICATIONS

Berkley, D.D., et al., "In situ Formation of Superconducting YBa$_2$Cu$_3$O$_{7-x}$ Thin Films Using Pure Ozone Vapor Oxidation", *Appl. Phys. Lett.,* V. 53, No. 20, pp. 1973–1975, Nov. 1988.

Bozovic, I., et al., "In situ Growth of Superconducting Single Crystal Bi–Sr–Ca–Cu–O Thin Films by Molecular Beam Epitaxy", *Science and Technology of Thin Film Superconductors II,* (R. McConnell, et al., eds.), Plenum, NY, pp. 267–272, 1990.

Bozovic, I., et al., Superconductivity in Epitaxial Bi$_2$Sr$_2$CuO$_6$/Bi$_2$Sr$_2$CaCu$_2$O$_8$ Superlattices: The Superconducting Behavior of Ultrathin Cuprate Slabs, *Journal of Superconductivity,* V. 5, No. 19, pp. 19–23, 1992.

Chakoumakos, B.C., et al., "Characterization and Superconducting Properties of Phases in the Bi–Sr–Cu–O System", *Journal of Materials Research,* V. 4, No. 4, pp. 767–780, Jul./Aug. 1989.

Eckstein, J.N., et al., "Atomically Layered Heteroepitaxial Growth of Single–Crystal Films of Superconducting Bi$_2$Sr$_2$Ca$_2$Cu$_3$O$_x$", *Appl. Phys. Lett.,* V. 57, pp. 931–933, Aug. 1990.

Fujita, J., et al., "In situ epitaxial Growth of Bi$_2$(Sr,Ca)$_3$Cu$_2$O$_x$ Films by Ion Beam Sputtering with an Atomic Oxygen Source", *Appl. Phys. Lett.,* V. 56, No. 3, pp. 295–297, Jan. 1990.

Hor, P.H., et al., "High–Pressure Study of the New Y–Ba–Cu–0 Superconducting Compound System", *Physical Review Letters,* V. 58, No. 9, pp. 911–912, Mar. 2, 1987.

Klausmeier–Brown, M. E., et al., "Accurate Measurement of Atomic Beam Flux by Pseudo–Double–Beam Atmoic Absorption Spectroscopy for Growth of Thin–Film Oxide Superconductors", *Appl. Phys. Lett.,* V. 60, pp. 657–659, Feb. 1992.

Li, Q., et al., "Interlayer Coupling Effect in High–T$_c$ Superconductors Probed by YBa$_2$Cu$_3$O$_{7-x}$/PrBa$_2$Cu$_3$O$_{7-x}$ Superlattices", *Physical Review Letters,* V. 64, No. 25, pp. 3086–3089, 1990.

(List continued on next page.)

Primary Examiner—William Krynski

(57) ABSTRACT

A thin-film of a high temperature superconducting compound having the formula $M_{1-x}CuO_{2-y}$, where M is Ca, Sr, or Ba, or combinations thereof, x is 0.05 to 0.3, and x>y. The thin film has a $T_c$ (zero resistivity) of about 40 K. Also disclosed is a method of producing the superconducting thin film.

6 Claims, 3 Drawing Sheets

OTHER PUBLICATIONS

Lowndes, D.H. et al., "Superconductivity in Nonsymmetric Epitaxial $YBa_2Cu_3O_{7-x}/PrBa_2Cu_3O_{7-x}$ Superlatices: The Superconducting Behavior of Cu–0 Bilayers" *Physical Review Letters,* V. 65, No. 9, pp. 1160–1163, Aug. 27, 1990.

Moodenbaugh, et al., "Superconductivity Near 90K in the Lu–Ba–Cu–0 System", *Physical Review Letters,* V. 58, No. 18, pp. 1885–1887, May 4, 1987.

Murphy, D.W., et al., "New Superconducting Cuprate Perovskites", *Physical Review Letters,* V. 58, No. 18, pp. 1888–1890, May 4, 1987.

Nakayama, Y., et al., Epitaxial Growth of Bi–Sr–Ca–Cu–0 Thin Films by Molecular Beam Epitaxy Technique with Shutter Control, *Japanese Journal of Applied Physics,* V. 28, No. 10, pp. L1809–L1811, 1989.

Phillips, J.C. et al., *Physics of High–$T_c$ Superconductors,* Academic Press, 1989.

Schlom, D.G., et al., "Molecular Beam Eqpitaxial Growth of Layered Bi–Sr–Ca–Cu–0 Compounds", *Journal of Crystal Growth,* No. 102, pp. 361–375, 1990.

Siegrist, T., et al., "The Parent Structure of the Layered High–Temperature Superconductors", *Nature,* V. 334, pp. 231–232, Jul. 1988.

Tarascon, J.M., et al., "Preparation Structure, and Properties of the Superconducting Compound Series $Bi_2Sr_2Ca_{n-1}Cu_nO_y$ with n=1, 2, and 3", *Physical Review B,* V. 38, No. 13, pp. 8885–8892, Nov. 1, 1988.

Triscone, J.M. et al., "Y–Ba–Cu–0/Dy–Ba–Cu–0 Superlattices: A First Step Towards the Artifical Construction of High–$T_c$ Superconductors", *Physical Review Lett.,* V. 63, No. 9, pp. 1016–1019, Aug. 28, 1989.

Wu, M.K., et al., "Superconductivy at 93K in a New Mixed–Phase Y–Ba–Cu–0 Compound System at Ambient Pressure", *Physical Review Letters,* V. 58, No. 9, pp. 908–910, Mar. 2, 1987.

Hiroi, Z., et al., "A New Superconducting Cupric Oxide Found in the Sr–Cu–O System," *Physica C. 185–189*:523–524 (1991).

Hiroi, Z., et al, "A new family of copper oxide superconductors $Sr_{n+1}Cu_nO_{2n+1+(}$ stabilized at high pressure," *Nature 365*:315–317 (1993).

Li, X., et al., "Epitaxial Growth and Properties of $Ca_{1-x}Sr_xCuO_2$ Thin Film (x=0.18 to 1.0) Prepared by Co–Deposition and Atomic Layer Stacking," *Jpn. J. Appl. Phys. 31*:L217–L220 (1992).

Takano, M., et al., "Superconductivity in the Ba–Sr–Cu–O system," *Physica C 176*:441–444 (1991).

Doss Engineer Guide to High Tc Superconductivity, Wiley & Sons 1989 pp. 128–131, 254–258.*

Zumdahl, "Chemistry", 1986 pp 801–802.*

Koinuma, "Fabrication by Laser MBE and In Situ Characterization of Layered Cuprates" in "Advances in Superconductiviey III" Nov. 1990.*

Scientific American, Aug. 1990, pp 42–49.*

Koinuma, Jap Journ. App. Phys. vol. 26, 5–87 L763–L765.*

Nakajima, Appl. Phys. Lett 53(15) Oct. 10, 1988 pp 1437–1439.*

* cited by examiner

THIN-FILM OF A HIGH-TEMPERATURE SUPERCONDUCTOR COMPOUND AND METHOD

FIELD OF THE INVENTION

The present invention relates to a thin film of a high-temperature superconductor compound, and to a method for producing the thin film.

REFERENCES

Berkley, D. D., et al., *Appl. Phys. Lett.* 53:1973 (1988).

Bozovic, I., et al., *Science and Technology of Thin Film Technology II* (R. McConnell, et al., eds.), Plenum, N.Y. p.267 (1990).

Bozovic, I., et al., *Journal of Superconductivity* 5:19 (1992).

Chakoumakos et al., *Journal of Materials Research* 4(4):767 (1989).

Eckstein, J. N., et al., *Appl. Phys. Lett.* 57:531 (1990).

Fujita et al., *Applied Physics Letters* 56(3):295–297 (1990).

Hor et al., *Physical Review Letters* 58(9):911–912 (1987).

Kawai, T., et al., to be published in *Proc. Mat. Res. Soc. Symp. S: Layered Superconductors: Fabrication, Properties and Applications* (D. T. Shaw, et al., eds.) (1992).

Klausmeier-Brown, M. E., et al., Appl. Phys. lett, 60:657 (1992).

Li, Q., et al., *Phys. Rev. Lett.* 64:3086 (1990).

Lowndes, D. H., et al., *Rhys. Rev. Lett.* 65:1160 (1990).

Moodenbaugh et al., *Physical Review Letters* 58(18):1885–1887 (1987).

Murphy et al., *Physical Review Letters* 58(18):1891–1894 (1987).

Nakayama et al., *Japanese Journal of Applied Physics* 28(10):L1809–L1811 (1989).

Phillips, J. C., "Physics of High-$T_c$ Superconductors", Academic Press (1989).

Schlom et al., *Journal of Crystal Growth* (1989).

Siegrist, T., et al., *Nature* 334:231 (1988).

Tarascon et al., *Physical Review B* 38(13):8885–8892 (1988).

Thompson, L. F., et al., eds. "Introduction to Photolithography", ACS Symposium Series, Washington, D.C., (1983).

Triscone, J. M., et al., *Phys. Rev. Lett.* 64:3086 (1990).

Wu et al., *Physical Review Letters* 58(9):908–910 (1987).

BACKGROUND OF THE INVENTION

High temperature superconducting (HTSC) compounds including mixed oxides of rare earth, alkaline earth and copper metals are known (e.g., Phillips). Wu et al., and Hor et al. have discussed Y—Ba—Cu—O compound systems as exhibiting HTSC. Moodenbaugh al., Murphy et al., and Hor et al. disclose additional rare earth, alkaline earth, copper metal mixed oxide compounds exhibiting superconductive properties. Additional superconducting mixed metal oxide compounds of La—Sr—Cu—O, Bi—Sr—Ca—Cu—O and Tl—Ba—Ca—Cu—O have also been developed.

Tarascon et al. disclose Bi—Sr—Ca—Cu—O superconducting compounds of the formula $Bi_2Sr_2Ca_{n-1}Cu_nO_y$, wherein n=1, 2 or 3 which are prepared by firing at high temperatures stoichiometric amounts of $Bi_2O_3$, $SrCO_3$ or $SrO_2$, and CuO powders. Similarly, Chakoumakos et al. have disclosed the preparation of Bi—Sr—Cu—O compounds, particularly $Bi_2Sr_2CuO_6$ compounds of the formula $Bi_2Sr_2Ca_{n-1}Cu_nO_x$, where n is from 1 to 5 which are formed by molecular beam epitaxy of layered structures. Eckstein et al. have also disclosed the formation of thin films of perovskite-related high-temperature superconductors using atomic layer molecular beam epitaxy.

One of the major goals in the technology of thin high-temperature superconducting electronics is to fabricate trilayer SIS Josephson Junctions. The major obstacle to achieving this goal is the large anisotropy of cuprate superconductors of the type referenced above, which results in a very short coherence length in the direction perpendicular to the $CuO_2$ layers, as well as in generally small critical current, $j_c\perp$, in that direction. The structural cause of at least a major part of this anisotropy is the existence of so-called "blocking layers" such as the Bi—O layer in $Bi_2Sr_2CaCu_2O_8$ (e.g., Beyers)

It is for that reason that a substantial interest has been generated by the first successful synthesis of $(Sr,Ca)CuO_2$. This so called "infinite layer" cuprate, also known as the "parent compound" of cuprate superconductors, was synthesized in 1988 at the AT&T Bell Laboratories (Siegrist). This compound has no "blocking layers". However, its transport properties were disappointing, in that the material was found to be semiconducting and showed no traces of superconductivity.

Several Japanese groups have investigated this material, and there have been some reports of superconductivity in the material in the popular press. So far, the claims failed to be confirmed in other laboratories.

More recently, data on a $(Sr,Ca)CuO_2$ thin film which showed resistance that at first increased with decreasing temperature in a semiconducting like-manner, but then turned over to decrease below about 60–80 K, has been reported. However, conductor resistance never reached zero, i.e., the samples were not completely superconducting (Kawai). The composition of the presumed minority superconducting phase was not identified.

SUMMARY OF THE INVENTION

In one aspect, the present invention includes a thin film of a high-temperature superconducting compound having the formula $M_{1-x}CuO_{2-y}$, where M is one or more of the alkaline earth metals Ca, Sr, or Ba, x is 0.05 to 0.3, and x>y. The compound is characterized by zero resistivity at a temperature of at least 35 K. In a preferred embodiment, M is Ca and Sr, at a ratio of Ca to Sr between about 1:1 to 5:1.

The compound may be formed of alternating atomic monolayers of $CuO_{2-y}$, and M, where the layer formed by M has between about 5–30% metal-atom vacancies, and substantially more such cation vacancies than oxygen-atom vacancies in the $CuO_{2-y}$ layers.

Also disclosed is a superconducting device composed of a substrate, and layered on the substrate, a thin film of a high-temperature superconducting compound of the type just described.

In another aspect, the invention includes a method of forming a superconducting device which includes a superconducting thin-film compound characterized by zero resistivity at a temperature of at least 35 K, and preferably higher, e.g., 40 K.

The method includes depositing on a substrate, by molecular beam epitaxy, successive atomic monolayers of Cu, and an alkaline earth metal M selected from one or more of Ca, Sr, and Ba, at a ratio of M:Cu of between 0.70–0.95:1. During the deposition step, a stream of ozone is directed against the deposited material on the substrate, thus forming alternate layers of $CuO_{2-y}$ and M, where the layer formed by M has between about 5–30% metal-atom vacancies, and substantially more vacancies than oxygen-atom vacancies in the $CuO_{2-y}$ layers. The layering steps are repeated until a desired film thickness is achieved.

These and other objects and features of the invention will be more fully understood when the following detailed description is read in conjunction with the accompanying drawings.

DETAILED DESCRIPTION OF THE INVENTION

I. Definitions

The terms below have the following meaning herein, unless otherwise noted.

A "high-temperature superconducting compound" is one having zero resistivity at a temperature greater than about 30 K (Kelvin).

The "critical temperature for zero resistivity" or "$T_c$ (zero)" is the temperature at which a superconductor compound first shows zero resistivity, as the temperature of the compound is lowered.

The "temperature of the onset of transition", or $T_c$(onset) is the temperature at which a superconductor compound first shows a sharp drop in resistivity, as the temperature of the compound is lowered.

A "thin-film superconducting compound" is one formed of alternate layers of $CuO_{2-y}$ and divalent and/or monovalent metal atoms, in the form of a thin film;

The "plane of the thin-film compound" is a plane parallel to the $CuO_{2-y}$ planes in the compound.

An "oxygen vacancy" in a $CuO_{2-y}$ plane in the thin-film compound is an oxygen-atom deficiency in the lattice of the $CuO_{2-y}$ plane, where "y" represents the average number of O vacancies per one formula unit.

An "alkaline earth vacancy" in the alkaline earth layer in the thin-film compound is a metal-atom deficiency in the lattice of the alkaline earth layer of the compound.

II. Thin-Film Superconducting Compound

The high-temperature superconducting thin-film compound of the invention has the formula $M_{1-x}CuO_{2-y}$, where M is one or more of the alkaline earth metals Ca, Sr, or Ba, x is 0.05 to 0.3, and x>y. The compound has a $T_c$ (zero) of greater than 35 K, and preferably higher, e.g., 40 K.

In one preferred embodiment, the alkaline earth metal is a combination of Ca and Sr, in a ratio of Ca:Sr of between about 1:1 to 5:1. However, compounds in which the alkaline earth metal is Ca alone, Ca in combination with Ba, Ca in combination with Sr and Ba, are also contemplated, as are compounds in which the metal is Sr or Ba alone, or in combination with each other. The metal may further include small quantities of other dopants, for example K or Rb. As long as the overall crystal structure of the compound of the recited formula is unaffected by such doping or cation replacement, such compounds are within the scope of the recited formula.

Figure 1A:
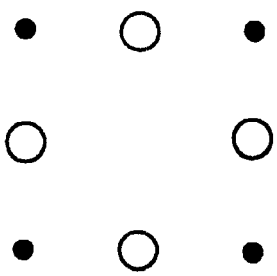
FIGS. 1A and 1B show proposed atomic lattice structures of the $CuO_{2-y}$ layer (planar view) and alternating $CuO_{2-y}$ and M layers (side view) in a thin film of a high-temperature superconductor compound, in accordance with the invention.
Figure 1B:
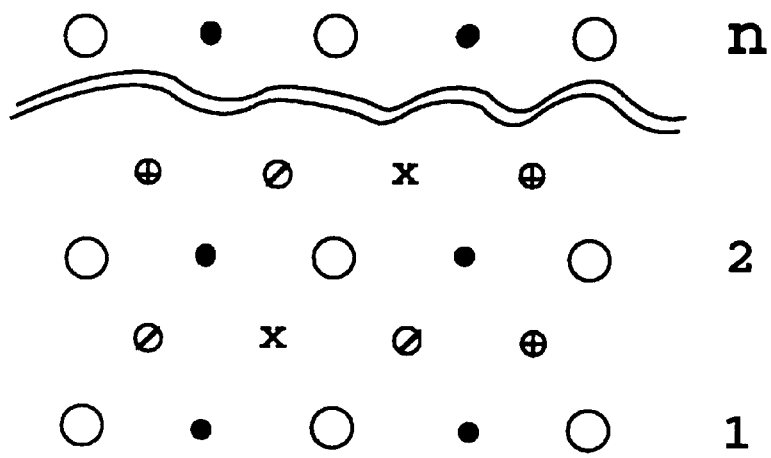

The thin-film compound of the present invention is composed of alternating layers of $CuO_{2-y}$ and the alkaline earth metal, such as Ca plus Sr. FIG. 1A shows the two-dimensional copper-oxygen plane which is relevant to the conduction process in the compound, where copper atoms are represented by small filled circles, and oxygen atoms, by larger open circles. The planar lattice structure of a $CuO_{2-y}$ layer shown is the lattice structure which has been shown to be formed under the epitaxial beam deposition conditions used in forming the compound (Section III).

The $CuO_{2-y}$ layers in the compound are separated by alkaline earth layers formed by depositing an atomic monolayer of Ca, Sr, and/or Ba over each $CuO_{2-y}$ monolayer. The mole ratio of total alkaline earth atoms, e.g., Ca plus Sr, to Cu is preferably between about 0.70:1 and 0.95:1. In a preferred structure, the Cu and oxygen-atom sites in the $CuO_{2-y}$ layer are substantially filled, i.e., y is close to 0, and the intervening M layers contain between about 5–30 mole percent vacancies, i.e., x is between 0.05 and 0.3, such that the alkaline-earth metal layer has substantially more metal-atom vacancies than the $CuO_{2-y}$ layer has oxygen-atom vacancies.

This proposed two-dimensional crystal lattice structure of the compound, in the direction normal to the layers, is shown in FIG. 2A, where the copper and oxygen atoms are represented as above, and Ca and Sr atoms "+" and "/" symbols within open circles, respectively. The vacancies in the metal layers are indicated by "x" symbols.

The thin film is typically formed to contain between about 10 and $10^4$ $CuO_{2-y}$ layers, to a final thin-film thickness of between about 0.01 and 10 microns. The area and geometric shape of the compound are determined by conventional masking techniques, or by photoetching methods applied after thin-film deposition, according to known methods (Thompson).

Figure 2:
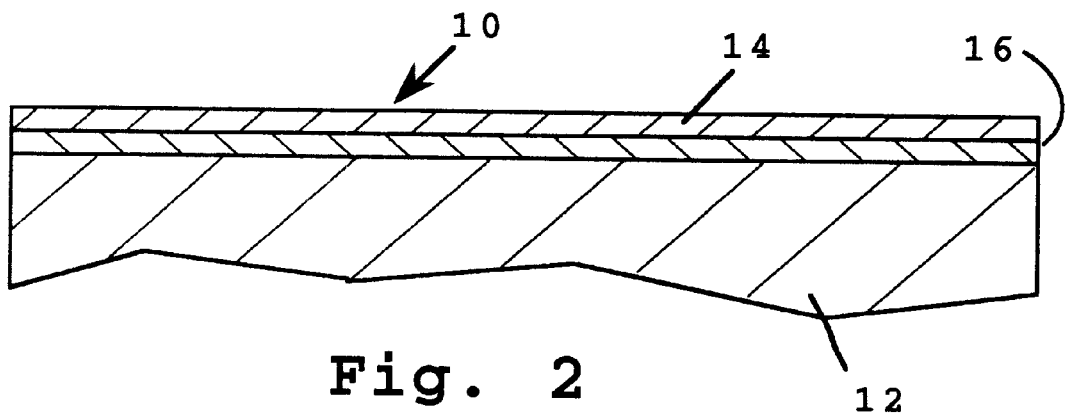
FIG. 2 is a cross-sectional view of a superconducting thin-film device constructed according to the invention.

FIG. 2 shows a thin-film superconducting device 10 constructed according to one embodiment of the invention. The device includes a substrate 12, such as a $SrTiO_3$ wafer, on which the superconductive thin layer indicated at 14 is deposited. The device may include other layered elements, such as insulative or buffer layer 16. In the device illustrated in Example 1, the buffer layer is a low-$T_c$ superconductor layer of $Bi_2Sr_2CuO_6$.

III. Method of Production

The thin-film superconductor compound of the invention is formed by a molecular beam epitaxy method in which atomic monolayers of Cu and alkaline earth metal atoms are alternately deposited on a substrate, in the presence of a stream of ozone. The method is also referred to herein as atomic layer-by-layer molecular beam epitaxy (ALL-MBE).

The ALL-MBE method allows very accurate sequencing of atoms supplied to the growing crystalline surface in such a way as to control kinetically the evolution of the chemical reaction coordinate for each molecular layer. As described below, evidence points to the conclusion that under the conditions of operation, only the top molecular layer is involved in the growth chemistry, so that precise sequences of molecular layers can be assembled into heterostructures such as superlattices, etc., with little or no intermixing.

Figure 3:
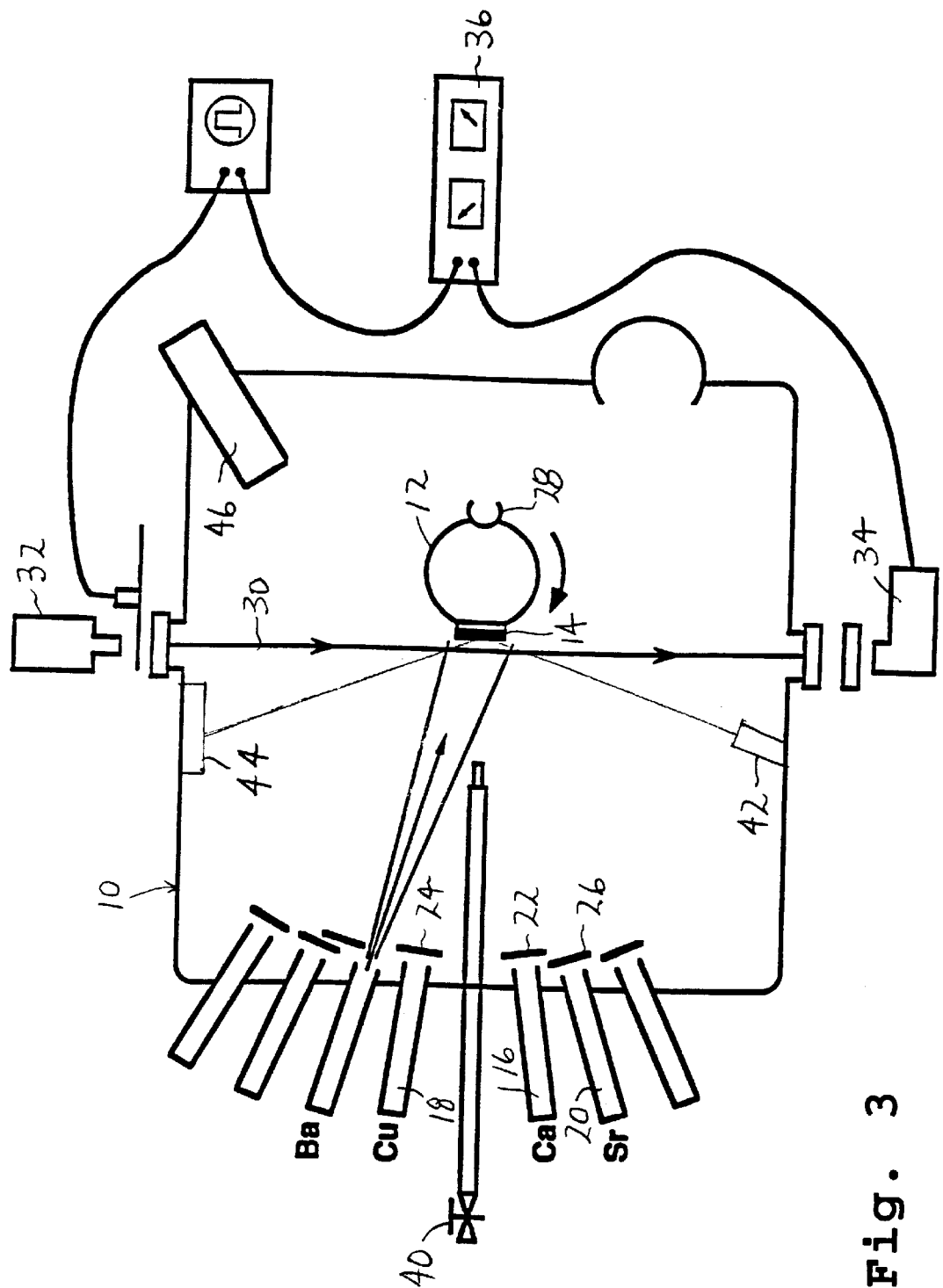
FIG. 3 is a schematic diagram of a modified molecular beam epitaxy chamber for use in forming the thin film of the invention.

FIG. 3 shows key features of an apparatus 10 used in carrying out the method. The apparatus includes a vacuum chamber 11 provided with a substrate holder 12 for positioning a substrate 14 during the deposition process. Preferably, but not necessarily, the substrate comprises a $SrTiO_3$ wafer in order to achieve lattice matching with the deposited compound. The chamber can be evacuated to an operational pressure of less than about $10^{-8}$ Torr.

It is preferred that the molecular beam epitaxy is conducted using a background pressure in the range of about $5 \times 10^{-6}$ to $2 \times 10^{-4}$ Torr, and more preferably at a pressure of about $1 \times 10^{-5}$ Torr. As may be apparent, the pressure at the substrate may be significantly higher, for example, 5 to 10 times higher, than the background pressure owing to differential pumping.

The apparatus also includes a plurality of source furnaces, such as furnaces 16, 18, 20 which in the formation of the novel compounds of the present invention are used for deposition of calcium, copper, and strontium, respectively. The source furnaces are standard molecular beam epitaxy (MBE) cells which can be heated to a selected temperature, e.g., 600° C. to 750° C. for Sr and Ca, and about 1,200° C. for Cu, to produce a desired atomic beam flux from each furnace. The beams are ejected through ports in the furnaces, and these ports are equipped with individual beam shutters, such as shutters 22, 24, 26 for furnaces 16, 18, 20, respectively.

The opening and closing of the individual beam shutters are controlled by conventional pneumatic cylinders (not shown) whose operation is controlled automatically by a computer control unit (not shown). The operation of the control unit, in controlling the sequence and timing of beam deposition, through the operation of the furnace shutters, will be described below.

The apparatus is provided with an ionization gauge 28 which is carried on one side of holder 12, as indicated. By rotating the holder to a position where gauge 28 is aligned with a selected beam, the beam flux can be accurately measured. Typically, the beam flux from each source is separately measured prior to and after growth, by rotating the ionization gauge 28 into the deposition position and noting the pressure change occurring when the shutter of each source is opened and closed. The resulting beam pressure readings may be converted to relative beam fluxes by means of a set of coefficients obtained from the analysis of many samples using Rutherford backscattering spectrometry to determine compositions.

Thus, the ionization gauge may be used to determine the deposition time required for the formation of each metal layer, assuming a constant beam density during successive layer deposition cycles. From this measurement, the time required to lay down an atomic-thickness layer (in the case of Cu) or an atomic-thickness layer with 5–30 mole percent metal-atom vacancies (in the case of Ca, Sr, and or Ba) can be determined.

In addition, the atomic flux from each source is monitored during deposition to an accuracy of better than one percent using a technique based on pseudo-double-beam atomic absorption spectroscopy (Klausmeier-Brown, et al.). All of the atomic absorption equipment resides outside the high vacuum chamber. In this technique, a mechanically chopped beam of light, such as beam 30 shown in the figure, from a hollow cathode lamp, such as lamp 32, passes through the atomic beam path just in front of the substrate position, and is detected using a photomultiplier tube 34 and a lock-in amplifier 36. Each atomic source requires its own lamp and optical path. By opening and closing the shutter during the measurement, a pseudo-double-beam effect is achieved, which makes the measurement immune to drifts in reflection and absorption by the viewport windows, gain settings on amplifiers and lamp emission intensity. The technique is sufficiently fast and accurate to detect and correct for changes in beam flux of less than one percent during growth.

In order to relate the atomic absorption signal from each source to the actual beam flux, calibration films are grown under identical thermodynamic conditions used for "real growths" and the resulting surface density of atoms in the film is obtained by Rutherford Back Scattering (RBS) analysis. Beam flux measurement and control by atomic absorption spectroscopy has proved critical to atomic-layer-by-layer growth of high quality HTS thin films. In particular, it has been found that films that are atomically flat and free of second phase defects can be made only if the growth accurately targets the correct elemental layer stoichiometries to within one to three percent, depending on the specific phase and element in question.

Oxygen is supplied to the growth chamber in the form of an ozone beam from an inlet valve 40 from any suitable source. In the embodiment shown schematically in the figure, an ozone generator (not shown) is provided by generating ozone from a suitable oxygen source. The apparatus is further provided with a turbo pump to pump the ozone mass flow.

A reflection high energy electron diffraction (RHEED) gun 42 and screen 44 in the apparatus are used for monitoring crystal structure during film deposition by molecular beam epitaxy. Also included in the apparatus is a quadrapole mass spectrometer 46 for characterizing the atomic species in the background gas.

As noted previously, the apparatus functions to deposit a predetermined sequence of atomic monolayers on the target. This sequence includes a substantially complete layer of $CuO_{2-y}$, followed by a Ca or Sr, or Ca plus Sr atomic monolayer having 5–30 percent vacancies.

While the ozone beam is directed at the substrate's surface, the shutter of the Sr and Ca source is opened and a first Sr, Ca atomic layer is deposited. As indicated above, the shutters controlling the beams of Sr and Ca are opened for a period calculated to deposit an atomic layer having between 5–30% metal atom vacancies. The ratio of Ca to Sr in the deposited layer is preferably between about 1:1 to 1:5. The desired ratio of different alkaline earth metals may be achieved by adjusting the temperatures of the furnaces to produce beam fluxes with the desired ratio, or by controlling shutter exposure times for the desired ratio, or a combination of these approaches.

When the deposition of the alkaline earth layer is complete, i.e., a single atomic layer with 5–30% vacancies is formed, the shutters from the Sr and Ca furnaces are closed and the shutter for Cu source is opened. A $CuO_{2-y}$ layer is then formed, preferably under conditions calculated to deposit a complete (no vacancies) single atomic-thickness Cu layer.

As indicated above, the times required for beam deposition for Cu, Sr, and Ca furnaces are determined initially from measurements of atomic beam densities made by ionization gauge 16. During operation, the shutter times for the Ca and Sr furnaces are adjusted to compensate for changes in the beam densities produced by the Ca and Sr targets, as measured by the atomic absorption system in the apparatus.

Figure 4:
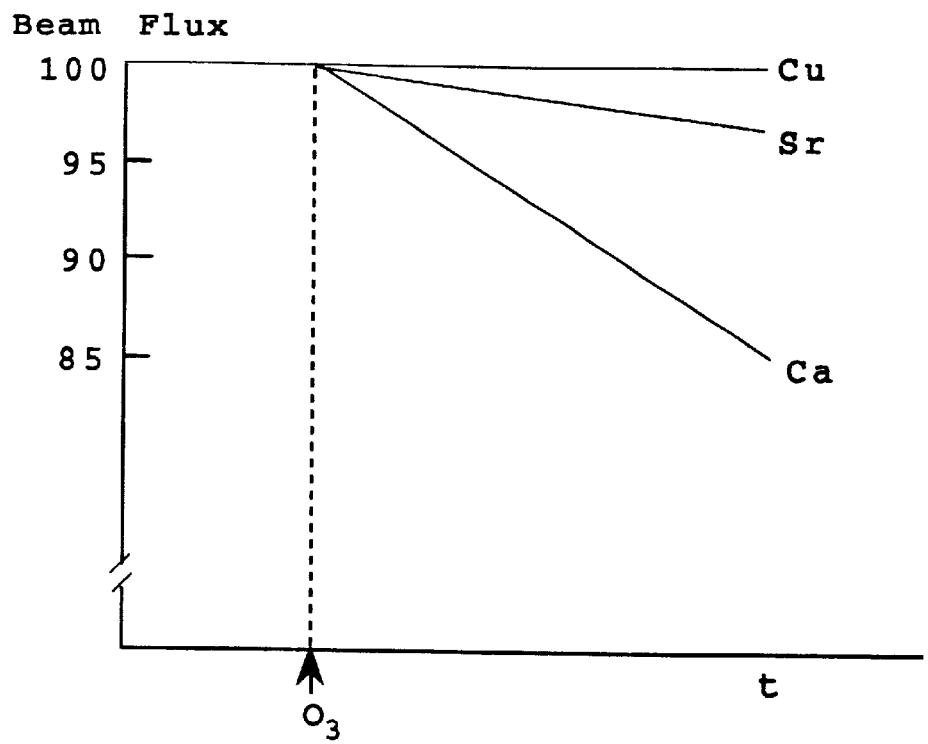
FIG. 4 is a graph of the rate of change of beam density, as a function of time, for Cu, Sr, and Ca at a fixed furnace temperature, in a molecular beam epitaxy chamber in which an ozone beam is directed at the target.

FIG. 4 shows the change in flux in both the Ca and Sr atomic beams in the presence of ozone, as measured by atomic absorption. The gradual reduction in flux in both the Ca and Sr beams may be due to the formation of an oxide shell on the target metal, which acts to reduce the rate of metal sublimation from the target. The Cu target, which exists as a melt at the deposition temperature, is unaffected by the presence of ozone.

Oxidation of the metal atoms in a growing HTS film is obtained using a controlled flux of ozone molecules (Berkley, et al.). In the case of cuprate superconductors, growth usually takes place between 600 and 750° C. At this temperature, the ozone is sufficiently reactive to fully oxidize the film even with a relatively low flux of ozone to the sample. The typical oxygen background pressure is between $5.0 \times 10^{-7}$ and $2.0 \times 10^{-5}$ Torr, which permits line-of-sight beam deposition and abrupt beam flux modulation using shutters. The temperature of the heated substrate is controlled to within 1° C. using optical pyrometry.

During growth, the surface structure is monitored on an atomic scale using reflection high energy diffraction (RHEED). This utilizes a thin, monoenergetic electron beam (10 KeV) which is incident on the crystal surface at a glancing angle of incidence. The electrons, with a deBroglie wavelength of about 0.15 Å, diffract from whatever periodic regularity is present on the surface.

The electrons diffract from this real space pattern, and in the far field form a k-space representation of the apparent surface periodicity. From a flat surface, the diffracted pattern is continuously streaky in one direction, since diffraction is taking place in the orthogonal direction only. In contrast, electrons incident on a surface that consists of oriented three dimensional microcrystals can pass through thin slabs of crystalline material, diffracting in both directions and giving a spotty far field pattern similar to that seen in transmission electron microscopy. Thus, the diffraction pattern displayed provides a k-space view of the crystallographic microstructure of the surface (specifically, the lattice constants and the symmetry), its relation to the underlying film, and its flatness or roughness on an atomic scale.

By appropriately choosing the sequence and number of atoms deposited on the growing surface, the nature of chemical reactions at the surface during the crystal growth—specifically, the sequence of transient chemical intermediate states characterizing the reactions that occur during the growth of each unit cell—can be studied, identified, and controlled. By studying the crystal structure of the surface with RHEED, while layered growth occurs, one obtains a real-time microscopic window on the chemical processes happening during the synthesis of each molecular layer.

The formation of successive layers of $CuO_{2-y}$ and alkaline earth metal(s) is continued until a desired thin film is produced. As indicated above, the film is typically prepared to contain 10 to $10^4$ layers, to a film thickness of between 0.01 and 10 microns.

As noted above, an important feature in producing the compounds of the present invention comprises the atomic layer by layer molecular beam epitaxial deposition of the disclosed sequence of compositions. The atomic beams employed in the deposition may be generated by an means known in the art including sputtering, laser ablation and thermal evaporation.

In preparing a thin film of the novel compounds according to the present invention, the material deposited by molecular beam epitaxy may be annealed at a temperature of about 700° C. for a short period of time, for example, several minutes or more. This annealing may improve the crystal structure of the deposited material. Additionally, after annealing the deposited material, additional sequences of atomic layers forming a unit cell may be deposited on the annealed material by the molecular beam epitaxial techniques discussed above in order to produce a film of a desired thickness. The resulting material, including the newly deposited layers, may be subjected to further annealing, if desired, for example at a temperature of about 400–800° C. in oxygen or ozone.

Figure 5:
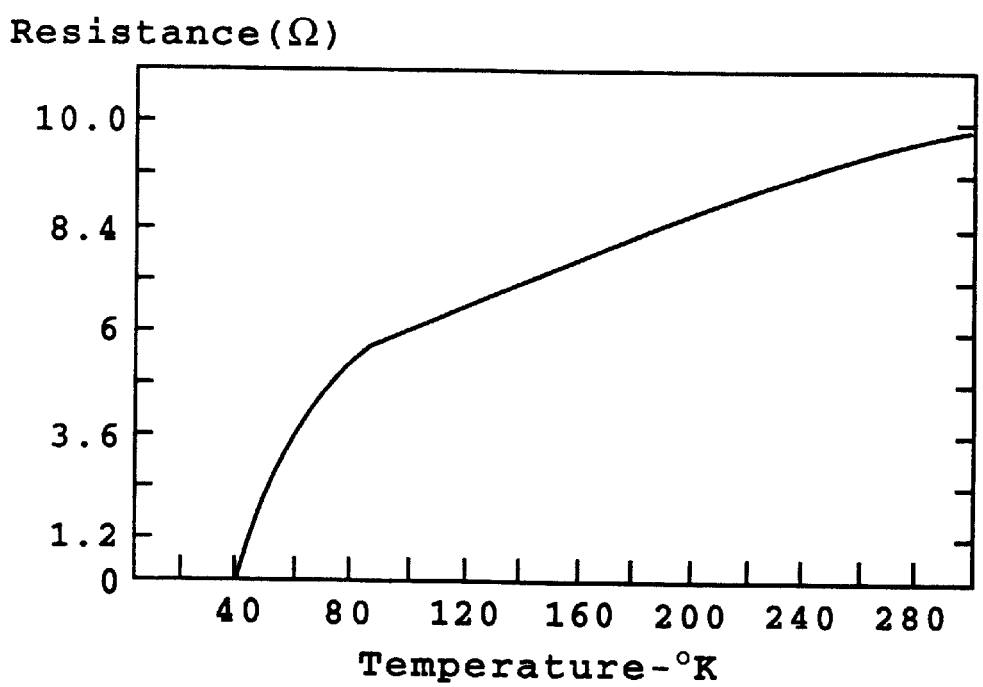
FIG. 5 shows the temperature dependence of resistivity, for current flowing in the direction of copper oxide planes, in a superconducting thin-film formed in accordance with the invention.

From the foregoing, it will be appreciated how various objects and features of the present invention are met. The thin film of the invention, as exemplified by the thin film produced as in Example 1, has a superconducting $T_c$(zero) temperature of about 40 K, with a $T_c$(onset) of about 80 K (FIG. 5).

At the same time, the alternating $CuO_{2-y}$ and alkaline earth metal layer structure is expected to have a relatively high critical current $J_c$ in the direction normal to the plane of the thin-film, due to absence of blocking Bi-containing layers in the film. The high $J_c$ values in the direction normal to the thin film in turn would allow a variety of applications of the thin-film, such as in the fabrication of a HTSC trilayer SIS Josephson Junction, where high critical currents in the direction normal to the layers is required.

The following example illustrates the formation and properties of an exemplary thin film formed in accordance with the invention.

EXAMPLE 1

A MBE apparatus similar to that shown in the FIG. 3 was employed to produce compounds according to the present invention. A $SrTiO_3$ wafer with a buffer layer of (low-$T_c$ superconductor) $Bi_2Sr_2CuO_6$ was heated to a temperature in the range of 650° C. to 700° C. and the background pressure employed in the growth system was about $1 \times 10^{-5}$ Torr. A continuous flow of ozone was directed to the growth chamber while the shutters for the source furnaces containing strontium, calcium and copper were alternatively opened and closed in order to deposit by molecular beam epitaxy a plurality of atomic layers on the wafer substrate. The shuttering intervals in the furnace were chosen to give a stoichiometry of Sr:Ca:Cu of about 0.2:0.7:1.

This film showed an atomic-layer-by-layer epitaxial growth, as well as very good crystallinity as judged by a clean, streaky RHEED pattern. It showed metallic behavior, with R(300K)/R(100K)>2. It further showed a superconducting transition, with the zero resistance at and below $T_c$(zero)≈40 K. On the R(T) curve, given in FIG. 5, it is clear that the superconducting transition begun at a much higher temperature, i.e., $T_c$(onset)>80 K.

This example is set forth to illustrate specific embodiments of the invention and is not intended to limit the scope of the compounds and methods of the present invention. Additional embodiments and advantages within the scope of the claimed invention will be apparent to one of ordinary skill in the art.

It is claimed:

1. A thin-film of a high-temperature superconducting compound which is formed of a predetermined sequence of alternating atomic monolayers of $CuO_{2-y}$ and M, wherein Cu has a quadratic structural coordination, a where the layers formed by M are specifically created with a preternatural metal-atom vacancy of about 5–30%, and substantially more vacancies than oxygen-atom vacancies, in the $CuO_{2-y}$ layers, said compound having the formula $M_{1-x}CuO_{2-y}$, where M is one or more alkaline earth metals selected from the group consisting of Ca, Sr, and Ba, $M_{1-x}$ is the mole ratio of total alkaline earth metals, x is 0.05 to 0.3, and x>y, said compound being characterized by zero resistivity at a temperature of at least 35 K.

2. The thin film of claim 1, wherein M is Ca and Sr, at a ratio of Ca to Sr between about 1:1 and 1:5.

3. The thin film of claim 1, which is synthesized by molecular beam epitaxy in the presence of ozone.

4. A superconducting device comprising a thin-film of a high-temperature superconducting compound which is formed of a predetermined sequence of alternating atomic monolayers of $CuO_{2-y}$ and M, wherein Cu has a quadratic structural coordination, and where the layers formed by M are specifically created with a preternatural metal-atom vacancy of about 5–30%, and substantially more vacancies than oxygen-atom vacancies in the $CuO_{2-y}$ layers, said compound having the formula $M_{1-x}CuO_{2-y}$, where M is one or more alkaline earth metals selected from the group consisting of Ca, Sr, and Ba, $M_{1-x}$ is the mole ratio of total alkaline earth metals, x is 0.05 to 0.3, and x>y, said compound being characterized by zero resistivity at a temperature of at least 35 K; and a chemically compatible substrate, lattice matched to said thin film of superconducting compound, said thin film being formed on said substrate.

5. The compound of claim 4, wherein M is Ca and Sr, at a ratio of Ca to Sr between about 1:1 and 1:5.

6. The device of claim 4, wherein the substrate is an $SrTiO_3$ wafer substrate.

* * * * *